(12) United States Patent
Kim et al.

(10) Patent No.: US 11,145,338 B2
(45) Date of Patent: Oct. 12, 2021

(54) SEMICONDUCTOR MEMORY DEVICE AND METHOD OF OPERATING THE SAME

(71) Applicant: SK hynix Inc., Icheon-si (KR)

(72) Inventors: Geonu Kim, Seoul (KR); Yong Soon Park, Seoul (KR); Won Sun Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/860,867

(22) Filed: Apr. 28, 2020

(65) Prior Publication Data

US 2021/0166737 A1 Jun. 3, 2021

(30) Foreign Application Priority Data

Nov. 28, 2019 (KR) .......................... 10-2019-0155939

(51) Int. Cl.
*G11C 7/10* (2006.01)
*G11C 16/14* (2006.01)

(52) U.S. Cl.
CPC .......... *G11C 7/1012* (2013.01); *G11C 7/1057* (2013.01); *G11C 7/1084* (2013.01); *G11C 16/14* (2013.01)

(58) Field of Classification Search
CPC ... G11C 7/1012; G11C 7/1057; G11C 7/1084; G11C 16/14
USPC ........................................ 365/189.02, 185.17
See application file for complete search history.

(56) References Cited

U.S. PATENT DOCUMENTS

| 6,065,112 | A | * | 5/2000 | Kishida | ................. | G06F 9/3017 |
|---|---|---|---|---|---|---|
| | | | | | | 708/524 |
| 2011/0085702 | A1 | * | 4/2011 | Nevatia | .................... | G06K 9/03 |
| | | | | | | 382/103 |
| 2020/0201649 | A1 | * | 6/2020 | Hush | ..................... | G06F 9/3001 |

FOREIGN PATENT DOCUMENTS

| KR | 101692432 B1 | 1/2017 |
|---|---|---|
| KR | 1020180068319 A | 6/2018 |

* cited by examiner

*Primary Examiner* — Huan Hoang
(74) *Attorney, Agent, or Firm* — William Park & Associates Ltd.

(57) ABSTRACT

A semiconductor memory device includes a storage, a buffer, and a control logic. The storage stores a first algorithm data. The buffer stores a second algorithm data that is at least partially different from the first algorithm data. The control logic is configured to selectively receive the first algorithm data and the second algorithm data.

17 Claims, 15 Drawing Sheets

US 11,145,338 B2

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0155939, filed on Nov. 28, 2019, in the Korean Intellectual Property Office, the entire disclosure of which is incorporated herein by reference.

BACKGROUND

1. Technical Field

The present disclosure relates to an electronic device, and more particularly, to a semiconductor memory device and a method of manufacturing the same.

2. Related Art

A semiconductor memory device may be formed in a two-dimensional structure in which strings are horizontally arranged on a semiconductor substrate. The semiconductor memory device may also be formed in a three-dimensional structure in which the strings are vertically stacked on the semiconductor substrate. A three-dimensional semiconductor memory device is a memory device that is designed to resolve a limitation with regard to the integration of two-dimensional semiconductor memory devices by utilizing a plurality of memory cells that are vertically stacked on a semiconductor substrate.

SUMMARY

In an embodiment, a semiconductor memory device, according to an embodiment of the present disclosure, includes a storage, a buffer, and a control logic. The storage stores a first algorithm data. The buffer stores a second algorithm data that is at least partially different from the first algorithm data. The control logic is configured to selectively receive the first algorithm data and the second algorithm data.

In an embodiment, a semiconductor memory device, according to another embodiment of the present disclosure, includes a memory cell array, a read and write circuit, a buffer, a storage, and a control logic. The memory cell array includes a plurality of memory cells. The read and write circuit performs any one of a program operation, a read operation, and an erase operation on the memory cell array. The buffer stores at least one of data that is input to the read and write circuit and data that is output from the read and write circuit. The storage stores a first algorithm data. The control logic controls an operation of the read and write circuit and the buffer. The buffer stores a second algorithm data that is at least partially different from the first algorithm data. The control logic selectively receives the first algorithm data and the second algorithm data.

According to still another embodiment of the present disclosure, a method of operating a semiconductor memory device including a storage storing a first algorithm data, a buffer, and a control logic includes inputting a second algorithm data that is at least partially different from the first algorithm data to the buffer, and selectively loading one of the first algorithm data and the second algorithm data to the control logic, and performing an operation based on the loaded algorithm data.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

An embodiment of the present disclosure provides a semiconductor memory device of which operation flexibility is improved and a method of operating the same.

The present technology may provide a semiconductor memory device of which operation flexibility is improved and a method of operating the same.

Figure 1:
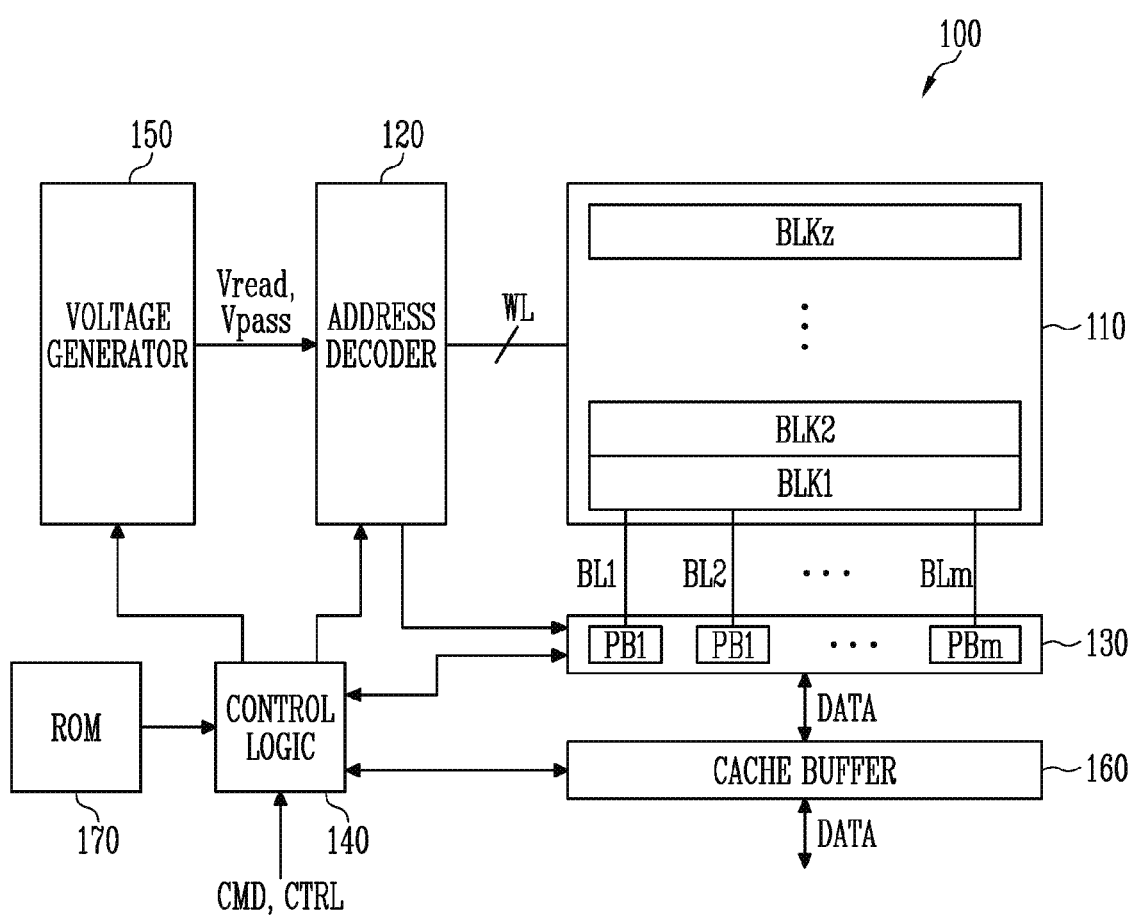
FIG. 1 is a block diagram, illustrating a semiconductor memory device, according to an embodiment of the present disclosure.

FIG. 1 is a block diagram, illustrating a semiconductor memory device, according to an embodiment of the present disclosure.

Referring to FIG. 1, the semiconductor memory device 100 includes a memory cell array 110, an address decoder 120, a read and write circuit 130, a control logic 140, a voltage generator 150, a cache buffer 160, and a read-only memory ROM.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells may be non-volatile memory cells, and the plurality of memory cells may have a vertical channel structure. The memory cell array 110 may also be configured as a memory cell array of a two-dimensional structure. However, according to the embodiment, the memory cell array 110 may be configured as a memory cell array of a three-dimensional structure. According to the embodiment, each of the plurality of memory blocks BLK1 to BLKz included in the memory cell array 110 may include a plurality of sub blocks. For example, each of the plurality of memory blocks BLK1 to BLKz may include two sub blocks. In another example, each of the plurality of memory blocks BLK1 to BLKz may include four sub blocks. The sub block, included in the memory blocks, is not limited thereto, and various numbers of sub blocks may be included in each of the memory blocks. Meanwhile, each of the plurality of memory cells that is included in the memory cell array may store at least one bit of data. In an embodiment, each of the plurality of memory cells that is included in the memory cell array 110 may be a single-level cell (SLC) storing one bit of data. In another embodiment, each of the plurality of memory cells that is included in the memory cell array 110 may be a multi-level cell (MLC) storing two bits of data. In still another embodiment, each of the plurality of memory cells that is included in the memory cell array 110 may be a triple-level cell storing three bits of data. In yet another embodiment, each of the plurality of memory cells that is included in the memory cell array 110 may be a quad-level cell storing four bits of data. According to an embodiment, the memory cell array 110 may include a plurality of memory cells, each storing five or more bits of data.

The address decoder 120, the read and write circuit 130, and the voltage generator 150 operate as a peripheral circuit that drives the memory cell array 110. The address decoder 120 is connected to the memory cell array 110 through the word lines WL. The address decoder 120 is configured to operate based on the outputs of the control logic 140.

The address decoder 120 is configured to decode a block address among the received addresses. The address decoder 120 selects at least one memory block based on the decoded block address. In addition, the address decoder 120 applies a read voltage Vread, generated by the voltage generator 150, to a selected word line of the selected memory block during a read voltage application operation, which occurs during a read operation. The address decoder 120 also applies a pass voltage Vpass to the remaining unselected word lines. In addition, during a program verify operation, the address decoder 120 applies a verify voltage that is generated in the voltage generator 150 to the selected word line of the selected memory block, while applying the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses that are received during a request of the read operation and the program operation include a block address, a row address, and a column address. The address decoder 120 selects one memory block and one word line based on the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change in the amount of current that is flowing based on the programmed state of a corresponding memory cell, through a node, while continuously supplying a sensing current to the bit lines that are connected to the memory cells. The plurality of page buffers PB1 to PBm also latches the sensed change as sensing data. The read and write circuit 130 operates in response to page buffer control signals that are output from the control logic 140.

During the read operation, the read and write circuit 130 senses the data of the memory cell, temporarily stores read data, and outputs data DATA to the cache buffer 160 of the semiconductor memory device 100. As an exemplary embodiment, the read and write circuit 130 may include a column selection circuit, and the like, in addition to the page buffers (or page registers).

The control logic 140 is connected to the address decoder 120, the read and write circuit 130, the cache buffer 160, and the voltage generator 150. The control logic 140 receives a command CMD and a control signal CTRL. The control logic 140 is configured to control the overall operations of the semiconductor memory device 100 in response to the control signal CTRL. In addition, the control logic 140 outputs a control signal to adjust the node precharge potential level of the plurality of page buffers PB1 to PBm. The control logic 140 may control the read and write circuit 130 to perform the read operation of the memory cell array 110. Meanwhile, the control logic may control the transfer of data between the read and write circuit 130 and the cache buffer 160.

The voltage generator 150 generates the read voltage Vread and the pass voltage Vpass during the read operation in response to a voltage generator control signal that is output from the control logic 140.

The cache buffer 160 may receive data DATA from an external device, temporarily store the data DATA, and then transfer the data DATA to the read and write circuit 130. In an embodiment, the cache buffer 160 may receive the data DATA for a program operation from an external controller and transfer the received data DATA to the read and write circuit 130. The read and write circuit 130 may program the data DATA that is received from the cache buffer 160 to selected memory cells of the memory cell array 110.

Meanwhile, the cache buffer 160 may temporarily store the data DATA that is received from the read and write circuit 130 and then transfer the data DATA to an external device. In an embodiment, the read and write circuit 130 may read the data DATA that is stored in the selected memory cells of the memory cell array 110. The data DATA, read from the read and write circuit 130, may be temporarily stored in the cache buffer 160. The cache buffer 160 may transfer read data, received from the read and write circuit 130, to the controller.

According to the semiconductor memory device 100, based on an embodiment of the present disclosure, the cache buffer 160 may store algorithm data to be loaded to the control logic 140. In this case, the algorithm data may be transferred to the cache buffer 160 from an external device. For example, at least some of the algorithm data that is used in a test operation of a test apparatus (not shown) of the semiconductor memory device 100 may be transferred to the cache buffer 160. The cache buffer 160 may store the received algorithm data. Meanwhile, the cache buffer 160 may transfer the stored algorithm data to the control logic 140 based on a control signal from the control logic 140.

A read-only memory 170, that is, the ROM 170, is a type of memory that may read stored data but cannot make any changes to the stored data. The ROM 170 may maintain contents that are stored therein even when power of the semiconductor memory device 100 is cut off. The ROM 170 may store algorithm data to perform overall operations of the semiconductor memory device 100. The algorithm data may include a code that is performed by the control logic 140 of the semiconductor memory device 100. The ROM 170 of the semiconductor memory device 100 may be implemented as a mask ROM, a programmable ROM (PROM), an erasable PROM (EPROM), and an electrically erasable PROM (EEPROM).

In the embodiment, the semiconductor memory device 100 may selectively load the algorithm data, stored in the ROM 170 and the cache buffer 160, to perform an operation based on the loaded algorithm data. Therefore, operation flexibility of the semiconductor memory device 100 may be improved.

In the embodiment shown in FIG. 1, the algorithm data is stored in the ROM 170. However, the present disclosure is not limited thereto, and various types of storage means may be included in the semiconductor memory device as a storage that stores the algorithm data in place of the ROM.

Meanwhile, in the embodiment shown in FIG. 1, the cache buffer 160 may be a component that stores the algorithm data in addition to the ROM 170. However, the present disclosure is not limited thereto, and the buffer may store the algorithm data without the ROM.

Figure 2:
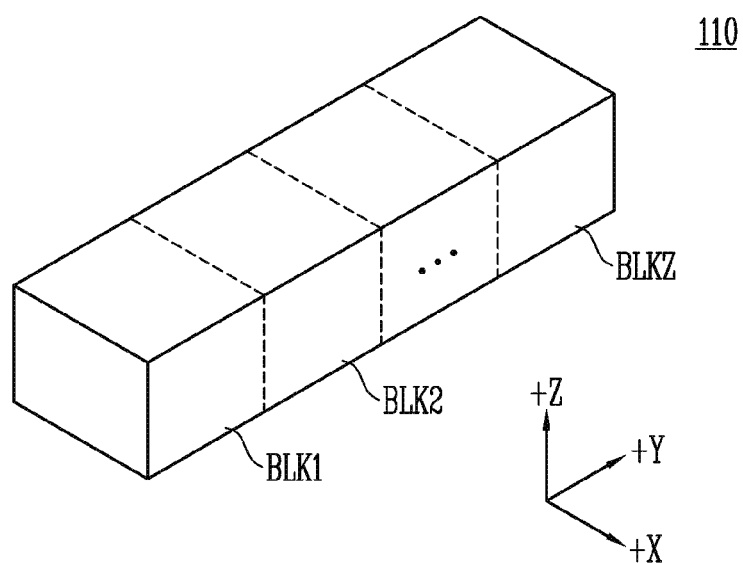
FIG. 2 is a block diagram, illustrating an embodiment of a memory cell array of FIG. 1.

FIG. 2 is a block diagram that illustrates an embodiment of the memory cell array 110 of FIG. 1.

Referring to FIG. 2, the memory cell array 110 includes a plurality of memory blocks BLK1 to BLKz. Each memory block has a three-dimensional structure. Each memory block includes a plurality of memory cells that are stacked on a substrate. Such a plurality of memory cells may be arranged along a +X direction, a +Y direction, and a +Z direction. A structure of each memory block is described in more detail with reference to FIGS. 3 and 4.

Figure 3:
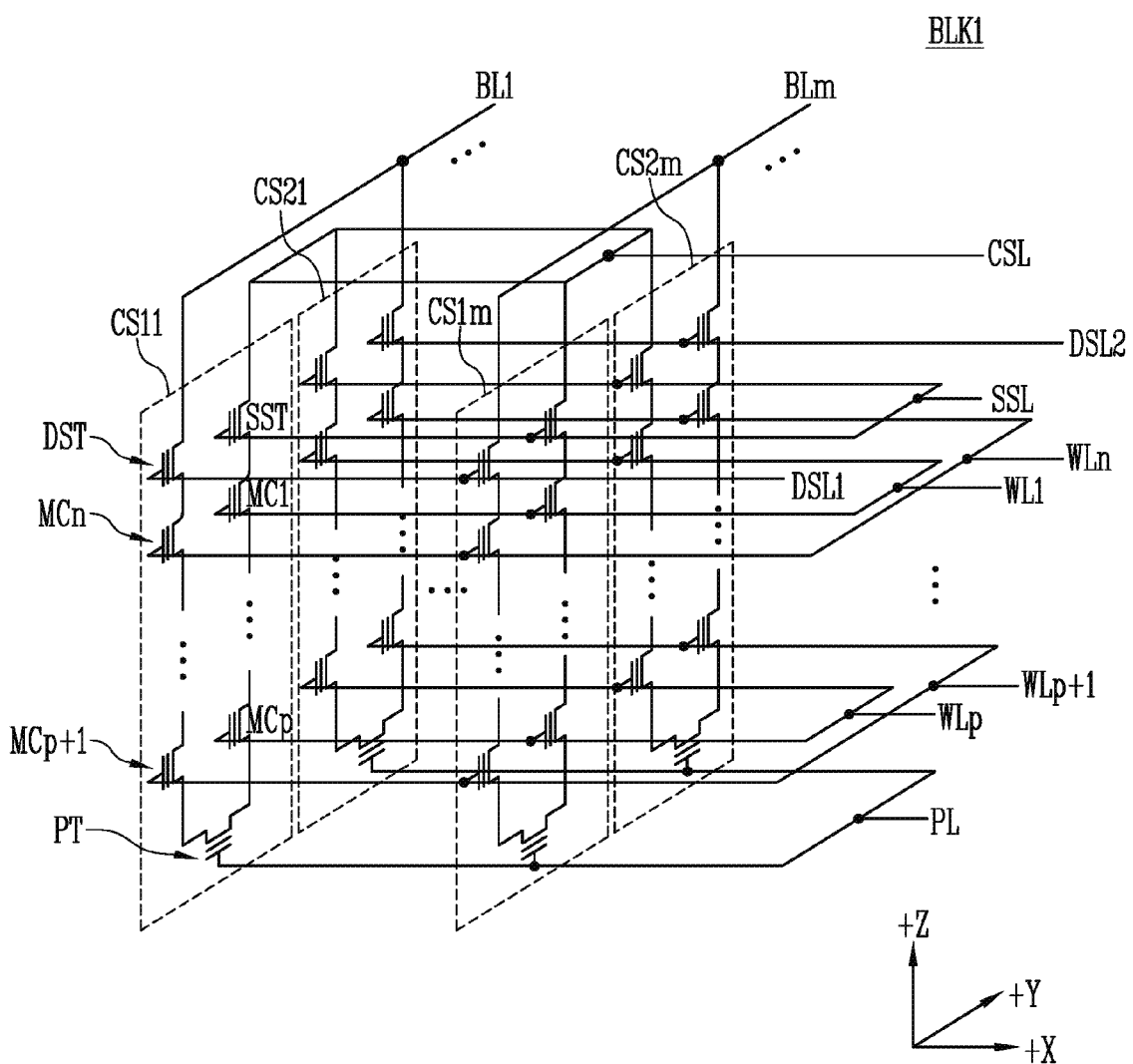
FIG. 3 is a circuit diagram, illustrating an embodiment of a first memory blocks BLK1 of FIG. 2.

FIG. 3 is a circuit diagram, illustrating an embodiment of a first memory blocks BLK1 of FIG. 2.

Referring to FIG. 3, a first memory block BLK1 includes a plurality of cell strings CS11 to CS1*m* and CS21 to CS2*m*. In the first memory block BLK1, m cell strings are arranged in a row direction (that is, the +X direction). The m cell strings, arranged in the row direction, are connected to the first to m-th bit lines BL1 to BLm, respectively. q (q is a natural number) cell strings are arranged in a column direction (that is, the +Y direction). In FIG. 3, only two cell strings, arranged in the column direction, are shown for convenience of description.

Each of the plurality of cell strings CS11 to CS1*m* and CS21 to CS2*m* is formed in a 'U' shape. Each of the plurality of cell strings CS11 to CS1*m* and CS21 to CS2*m* includes a pipe transistor PT, memory cells MC1 to MCn, a source select transistor SST, and a drain select transistor DST. Each of the plurality of cell strings CS11 to CS1*m* and CS21 to CS2*m* may be stacked on a substrate (not shown) under the memory block BLK1.

Each of the select transistors SST and DST and the memory cells MC1 to MCn may have a similar structure. For example, each of the select transistors SST and DST and the memory cells MC1 to MCn may include a channel layer, a tunneling insulating film, a charge storage film, and a blocking insulating film, each connected to a corresponding row line.

The source select transistor SST of each cell string is connected between a common source line CSL and the memory cells MC1 to MCp. A gate of the source select transistors SST is commonly connected to a source select line SSL.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp and the (p+1)-th to n-th memory cells MCp+1 to MCn may be connected through the pipe transistor PT. The first to p-th memory cells MC1 to MCp may be sequentially arranged in a −Z direction. The first to p-th memory cells MC1 to MCp may be connected, in series, between the source select transistor SST and the pipe transistor PT. The (p+1)-th to n-th memory cells MCp+1 to MCn may be sequentially stacked in the +Z direction. The (p+1)-th to n-th memory cells MCp+1 to MCn may be connected, in series, between the pipe transistor PT and the drain select transistor DST. Gates of the first to n-th memory cells MC1 to MCn are connected to the first to the n-th word lines WL1 to WLn, respectively.

A gate of the pipe transistor PT of each cell string may be connected to a pipe line PL.

The drain select transistor DST of each cell string may be connected between a corresponding bit line and the memory cells MCp+1 to MCn. The drain select transistors DST of the cell strings CS11 to CS1m of a first row may be connected to a first drain select line DSL1. The drain select transistors DST of the cell strings CS21 to CS2m of a second row may be connected to a second drain select line DSL2.

Finally, the cell strings (for example, CS11 to CS1m), arranged in the same row (+X direction), may be connected to the same drain select line (for example, DSL1) through the corresponding drain select transistors. The cell strings (for example, CS11 and CS21), arranged in different rows, may be connected to different drain select lines DSL1 and DSL2.

Figure 4:
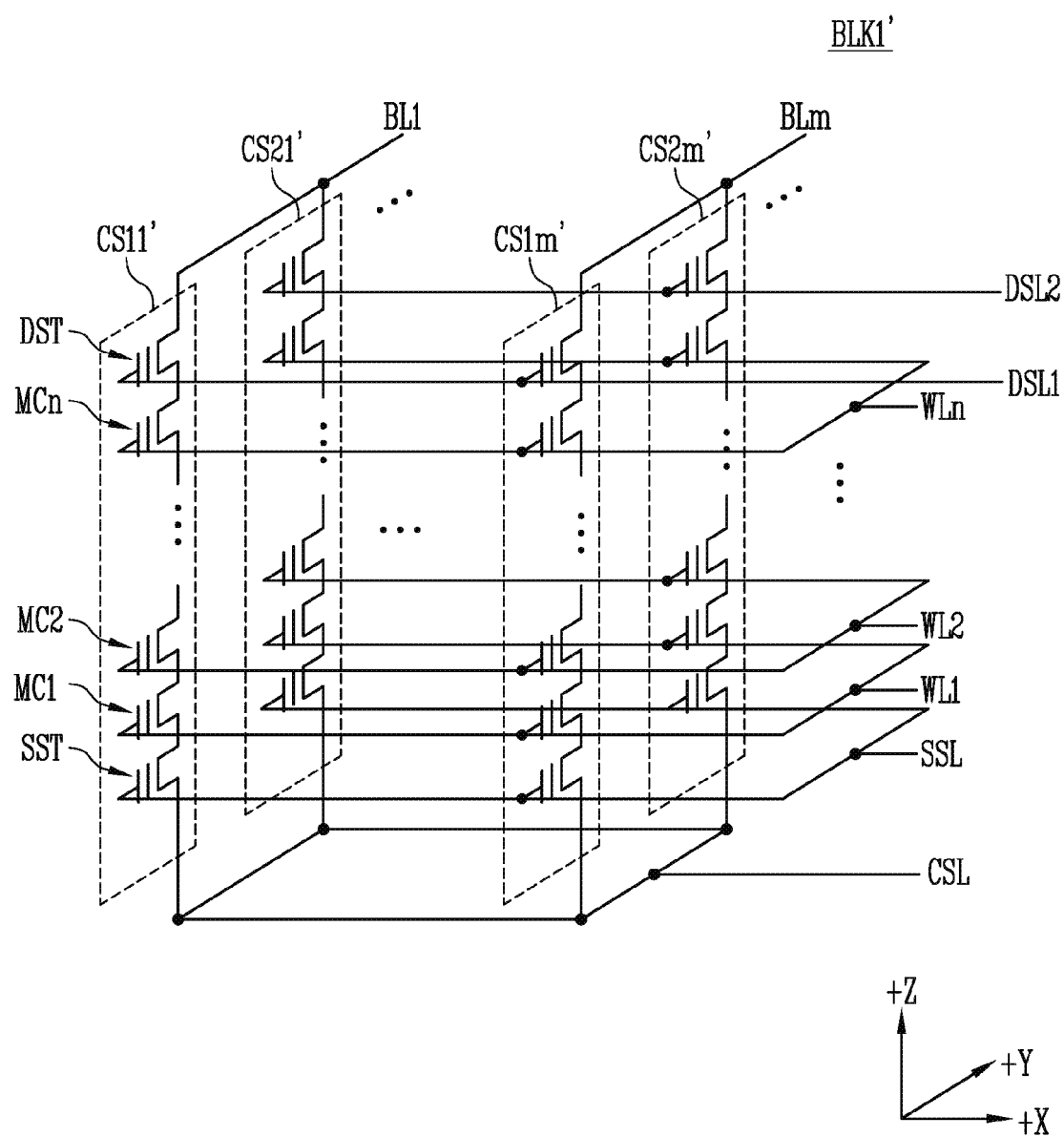
FIG. 4 is a circuit diagram that illustrates another embodiment of any one of the memory blocks BLK1 to BLKz of FIG. 2.

FIG. 4 is a circuit diagram that illustrates another embodiment of any one of the memory blocks BLK1 to BLKz of FIG. 2.

Referring to FIG. 4, a first memory block BLK1' may include a plurality of cell strings CS11' to CS1m' and CS21' to CS2m'. In the first memory block BLK1, m cell strings may be arranged in the row direction (that is, the +X direction). The m cell strings, arranged in the row direction, may be connected to the first to m-th bit lines BL1 to BLm, respectively. q (q is a natural number) cell strings may be arranged in the column direction (that is, the +Y direction). In FIG. 4, only two cell strings, arranged in the column direction, are shown for convenience of description.

Each of the plurality of cell strings CS11' to CS1m' and CS21' to CS2m' may extend along the +Z direction. Each of the plurality of cell strings CS11' to CS1m' and CS21' to CS2m' may include the source select transistor SST, the first to n-th memory cells MC1 to MCn, and the drain select transistor DST, stacked on a substrate (not shown), under the memory block BLK1'.

The source select transistors SST of each cell string may be commonly connected to the common source line CSL. The source select transistors SST of each cell string may be connected between the common source line CSL and the memory cells MC1 to MCn. The gate of the source select transistor SST of each cell string may be connected to the source select line SSL.

The first to n-th memory cells MC1 to MCn of each cell string may be connected, in series, between the source select transistor SST and the drain select transistor DST. The memory cells of the same height may be connected to the same word line. The first to n-th memory cells MC1 to MCn may be connected to the first to n-th word lines WL1 to WLn, respectively.

The drain select transistor DST of each cell string may be connected between the corresponding bit line and the memory cells MC1 to MCn. The drain select transistors of the cell strings, arranged in the same row (+X direction), may be connected to the same drain select line. The drain select transistors DST of the cell strings CS11' to CS1m' of the first row may be connected to the first drain select line DSL1. The drain select transistors DST of the cell strings CS21' to CS2m' of the second row may be connected to the second drain select line DSL2.

As a result, the memory block BLK1' of FIG. 4 may have a circuit similar to the memory block BLK1 of FIG. 3, except for the fact that the pipe transistor PT is excluded from each cell string in FIG. 4.

In FIG. 4, the first to m-th cell strings CS11' to CS1m' or CS21' to CS2m', arranged in the row direction, may be connected to the first to m-th bit lines BL1 to BLm, respectively. As another embodiment, even bit lines and odd bit lines may be provided instead of the first to m-th bit lines BL1 to BLm. In addition, it may be understood that even-numbered cell strings among the cell strings CS11' to CS1m' or CS21' to CS2m', arranged in the row direction, may be connected to even bit lines. Furthermore, odd-numbered cell strings among the cell strings CS11' to CS1m' or CS21' to CS2m', arranged in the row direction, may be connected to odd bit lines, respectively.

Figure 5:
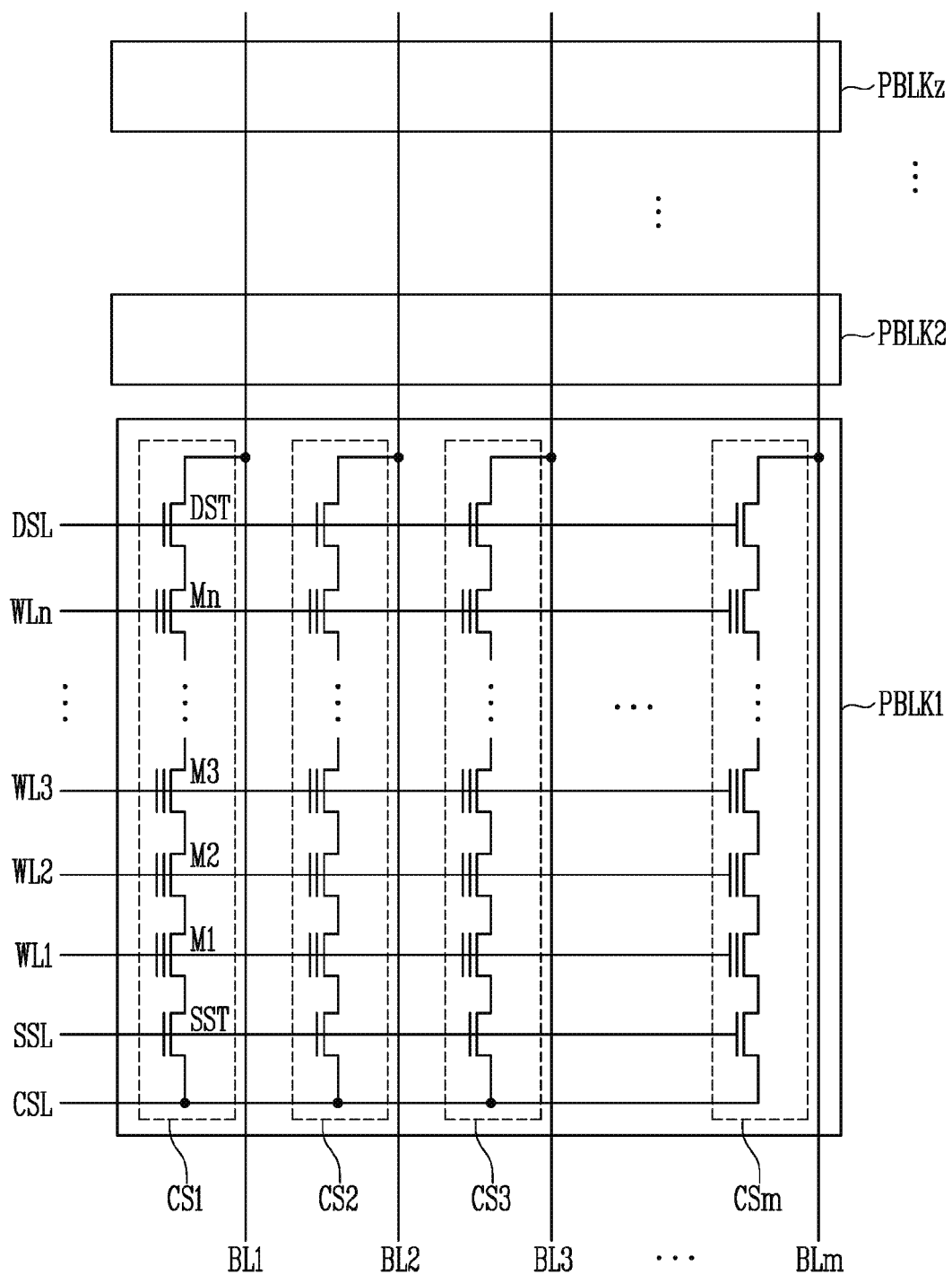
FIG. 5 is a block diagram, illustrating another embodiment of the memory cell array of FIG. 1.

FIG. 5 is a block diagram that illustrates another embodiment of the memory cell array 110 of FIG. 1.

The technical spirit of the present disclosure may be applied to a case where the memory cells are arranged as a two dimensional structure. Referring to FIG. 5, the memory cell array 110 may include a plurality of planar memory blocks PBLK1 to PBLKz. Each of the plurality of planar memory blocks PBLK1 to PBLKz may include first to m-th cell strings CS1 to CSm. The first to m th cell strings CS1 to CSm may be connected to the first to m-th bit lines BL1 to BLm, respectively.

Each of the cell strings CS1 to CSm may include a source select transistor SST, a plurality of memory cells M1 to Mn, and a drain select transistor DST, all of which being connected in series. The source select transistor SST may be connected to the source select line SSL. The first to n-th memory cells M1 to Mn may be connected to the first to n-th word lines WL1 to WLn, respectively. The drain select transistor DST may be connected to the drain select line DSL. A source side of the source select transistor SST may be connected to the common source line CSL. A drain side of the drain select transistor DST may be connected to a corresponding bit line. The source select line SSL, the first to n-th word lines WL1 to WLn, and the drain select line DSL may be included in the row lines RL of FIG. 1. The source select line SSL, the first to n-th word lines WL1 to WLn, and the drain select line DSL may be driven by the address decoder 120.

As an embodiment, each of the memory cells may be a non-volatile memory cell.

Figure 6A:
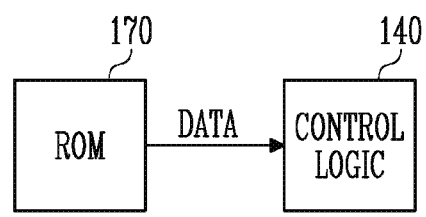
FIG. 6A is a diagram, illustrating a configuration in which algorithm data is transferred in an exemplary semiconductor memory device.

FIG. 6A is a diagram that illustrates a configuration in which algorithm data is transferred in an exemplary semiconductor memory device.

As described above, the ROM may store the algorithm data to perform overall operations of the semiconductor memory device 100. The algorithm data may include a code that is performed by the control logic 140 of the semiconductor memory device 100.

Such algorithm data DATA may be transferred to the control logic. The control logic may generally control the semiconductor memory device 100 to perform an operation that corresponds to the received algorithm data.

FIG. 6A illustrates an example of a structure in which the control logic receives the algorithm data DATA that is stored in the ROM. In this case, the control logic may be configured as a microcontroller.

In another example, the semiconductor memory device might not use the microcontroller and the ROM as components configuring the control logic. In this case, the algorithm data might not be stored in the ROM, but may be configured by being coupled to the control logic in a form of a finite state machine.

Meanwhile, according to the exemplary configuration shown in FIG. 6A, the algorithm data DATA may be stored only in the ROM. Therefore, the ROM is required to have the space to store all algorithm data. In this case, the semiconductor memory device needs to have a ROM with a larger capacity, increasing the manufacturing cost of the semiconductor memory device.

Meanwhile, as described above, the ROM is a memory that may read the stored data, but cannot make any changes to the stored data. Therefore, when the algorithm data that is stored in the ROM is required to be modified, the ROM itself is required to be replaced. This makes it difficult to correct the algorithm data frequently. In a test operation of the semiconductor memory device 100, the algorithm data may be required to be modified and applied. When all algorithm data is stored in the ROM, it may be difficult to apply various algorithm data during the test operation.

Figure 6B:
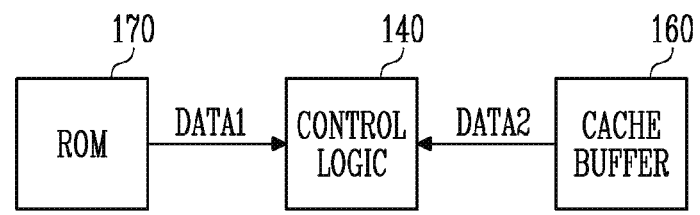
FIG. 6B is a diagram, illustrating a configuration in which the algorithm data of the semiconductor memory device, according to an embodiment of the present disclosure is transferred.

FIG. 6B is a diagram, illustrating a configuration in which the algorithm data of the semiconductor memory device, according to an embodiment of the present disclosure is transferred.

Referring to FIG. 6B, the control logic 140 may receive the algorithm data from the cache buffer 160 as well as the ROM 170. That is, the ROM 170 may provide first algorithm data DATA1 of the algorithm data to the control logic 140. In addition, the cache buffer 160 may provide second algorithm data DATA2 of the algorithm data to the control logic.

The cache buffer 160 may include at least one cache latches that corresponds to each bit line. That is, the cache buffer 160 may be used as a storage space of specific data. However, since the cache buffer 160 is a volatile memory, it is difficult to use the cache buffer 160 in the same manner as the ROM 170 which is a non-volatile memory. That is, the cache buffer 160 might not permanently apply the algorithm data. However, in some cases, the algorithm data may be temporarily stored in cache buffer 160 and the control logic 140 may use the algorithm data that is stored in the cache buffer 160.

For example, during the test operation of the semiconductor memory device 100, at least some of the algorithm data, used only for the test, may be stored in the cache buffer 160 as the second algorithm data DATA2. The second algorithm data DATA2 may be provided to the cache buffer 160 from an external device, such as the test apparatus. During the test operation of the semiconductor memory device 100, the control logic 140 may receive the first algorithm data DATA1 from the ROM 170 and the second algorithm data DATA2 from the cache buffer 160. In this case, during the test operation, the second algorithm data that is stored in the cache buffer 160 may be easily modified. The modified second algorithm data may be stored in the cache buffer 160, received from the external device. Meanwhile, during a user operation, besides the test operation of the semiconductor memory device 100, the second algorithm data DATA2 might not be required to be stored in the cache buffer 160.

That is, the control logic 140, according to an embodiment of the present disclosure, may selectively load the algorithm data, stored in the cache buffer 160 and the ROM 170, and perform an operation based on the loaded algorithm data. Therefore, the size required for the ROM 170 to store the algorithm data may be reduced. In addition, the algorithm data that is stored in the cache buffer 160 may be easily modified. Therefore, the operation flexibility of the semiconductor memory device 100 may be improved.

In the embodiment shown in FIG. 6B, the first algorithm data DATA1 is stored in the ROM. However, the present disclosure is not limited thereto, and various types of storage means may be included in the semiconductor memory device as the storage that stores the first algorithm data DATA1. Meanwhile, in the embodiment shown in FIG. 6B, the second algorithm data DATA2 is stored in the cache buffer. However, the present disclosure is not limited thereto, and various types of buffers may be included in the semiconductor memory device as a component that stores the algorithm data DATA2.

Figure 7:
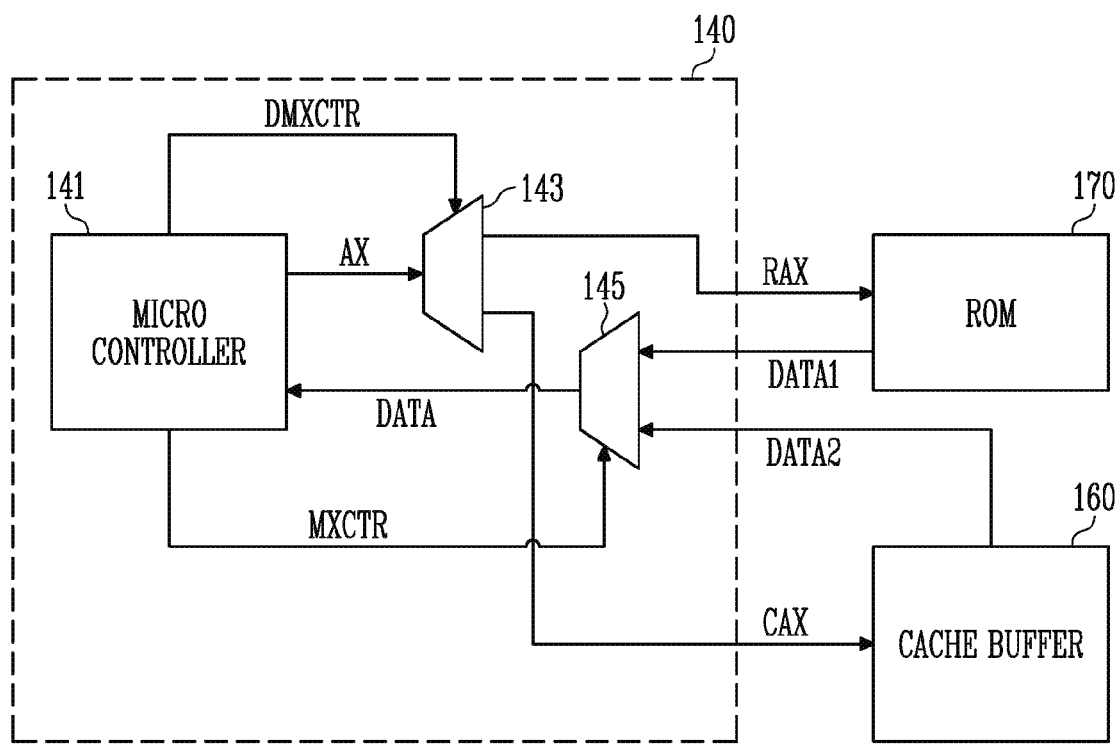
FIG. 7 is a block diagram, illustrating an exemplary embodiment of a control logic, according to an embodiment of the present disclosure.

FIG. 7 is a block diagram, illustrating an exemplary embodiment of the control logic, according to an embodiment of the present disclosure. FIG. 7 shows the control logic 140, the cache buffer 160, and the ROM 170.

Referring to FIG. 7, the control logic 140 may include a microcontroller 141, a demultiplexer 143, and a multiplexer 145. The microcontroller 141 may be a controller in which elements such as a processor, a memory, an input/output bus, and the like are embedded in an integrated circuit. The microcontroller 141 may receive the algorithm data DATA through the multiplexer 145 and control the entirety of the semiconductor memory device 100 to perform an operation that corresponds to the received algorithm data. The microcontroller 141 may output address data AX, indicating the position in which the algorithm data to be executed is stored. The output address data AX may be transferred to the demultiplexer 143. In addition, the microcontroller 141 may receive the algorithm data DATA that corresponds to the output address data AX. Meanwhile, the microcontroller 141 may output a DEMUX control signal DMXCTR to control the demultiplexer 143, and output a MUX control signal MXCTR to control the multiplexer 145.

The demultiplexer 143 may transfer the address data AX, received from the microcontroller 141, to one of the ROM 170 and the cache buffer 160, based on the DEMUX control signal DMXCTR. When the address data AX is an address data for receiving the algorithm data DATA from the ROM 170, the microcontroller 141 may output the DEMUX control signal DMXCTR to control the demultiplexer 143 to transfer the address data AX to the ROM 170. When the address data AX is an address data for receiving the algorithm data DATA from the cache buffer 160, the microcontroller 141 may output the DEMUX control signal DMXCTR to control the demultiplexer 143 to transfer the address data AX to the cache buffer 160.

When the address data AX is the address data for receiving the algorithm data DATA from the ROM 170, the demultiplexer 143 may transfer the address data AX to the ROM 170 as ROM address data RAX. When the address data AX is the address data for receiving the algorithm data DATA from the cache buffer 160, the demultiplexer 143 may transfer the address data AX to the cache buffer 160 as cache address data CAX.

The multiplexer 145 may select any one of the first algorithm data DATA1, received from the ROM 170, and the second algorithm data DATA2, received from the cache buffer 160, based on the MUX control signal MXCTR. The multiplexer 145 may transfer the selected one to the microcontroller 141 as the algorithm data DATA. When the address data AX is the address data for receiving the algorithm data DATA from the ROM 170, the microcontroller 141 may output the MUX control signal MXCTR for controlling the multiplexer 145 to output the first algorithm data DATA1. When the address data AX is the address data for receiving the algorithm data DATA from the cache buffer 160, the microcontroller 141 may output the MUX control signal MXCTR for controlling the multiplexer 145 to output the second algorithm data DATA2.

When the address data AX is transferred to the ROM 170 as the ROM address data RAX, the ROM 170 may transfer the first algorithm data DATA1 to the multiplexer 145. In this case, the multiplexer 145 may transfer the first algorithm data DATA1 as the algorithm data DATA to the microcontroller 141 based on the MUX control signal MXCTR. When the address data AX is transferred to the cache buffer 160 as the cache address data CAX, the cache buffer 160 may transfer the second algorithm data DATA2 to the multiplexer 145. In this case, the multiplexer 145 may transfer the second algorithm data DATA2 as the algorithm data DATA to the microcontroller 141 based on the MUX control signal MXCTR.

In the embodiment shown in FIG. 7, the first algorithm data DATA1 is stored in the ROM. However, the present disclosure is not limited thereto, and various types of storage means may be included in the semiconductor memory device as the storage that stores the first algorithm data DATA1. Meanwhile, in the embodiment shown in FIG. 6B, the second algorithm data DATA2 is stored in the cache buffer. However, the present disclosure is not limited thereto, and various types of buffers may be included in the semiconductor memory device as a component that stores the algorithm data DATA2.

Meanwhile, in the embodiment shown in FIG. 7, the microcontroller 141 may be a component that controls the entirety of the semiconductor memory device 100 to receive the algorithm data through the multiplexer 145 and perform the operation that corresponds to the received algorithm data. However, the present disclosure is not limited thereto, and various types of controllers, in addition to the microcontroller, may be configured to control the entirety of the semiconductor memory device 100 to receive the algorithm data DATA and perform the operation that corresponds to the received algorithm data.

Figure 8:
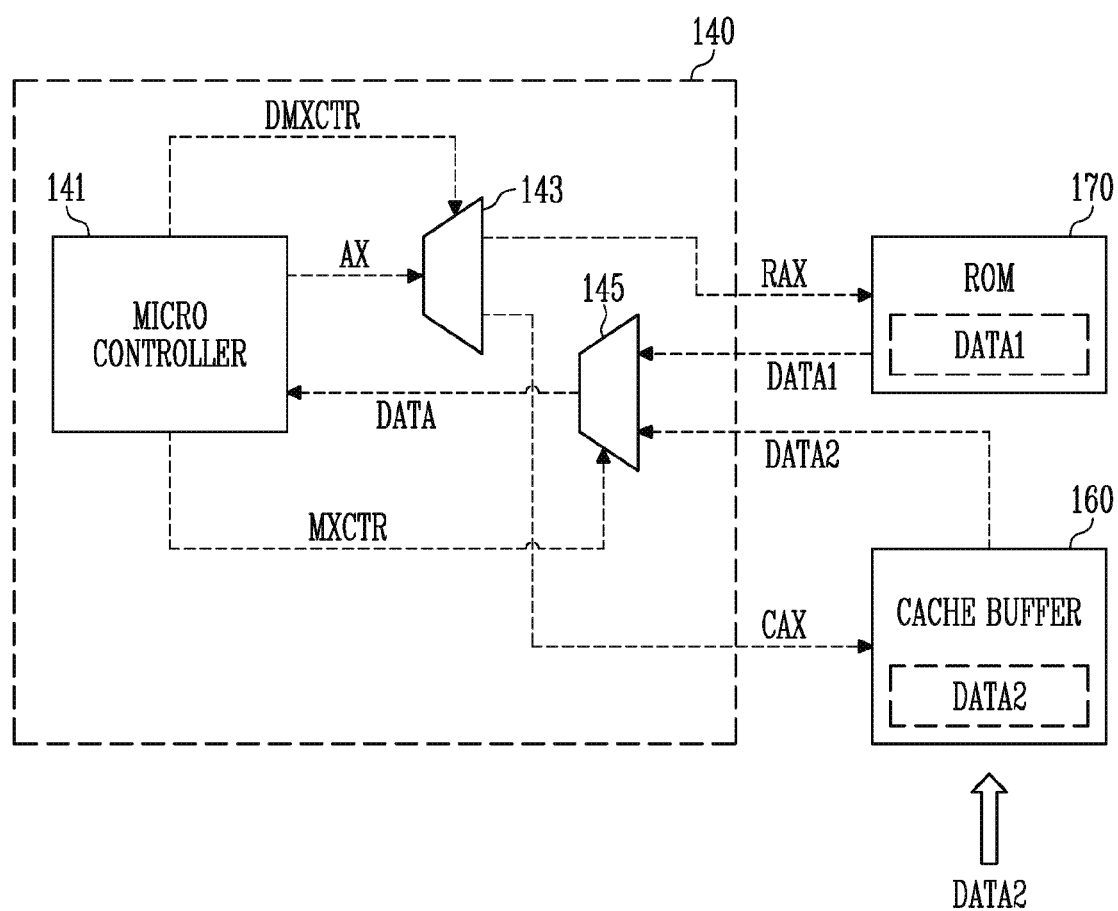
FIG. 8 is a diagram, illustrating an operation of storing the algorithm data in a cache buffer of the control logic, shown in FIG. 7.

FIG. 8 is a diagram that illustrates an operation of storing the algorithm data in the cache buffer of the control logic shown in FIG. 7.

The cache buffer 160 may be required to first store the second algorithm data DATA2 so that the cache buffer 160 transfers the second algorithm data DATA2 to the microcontroller 141. The second algorithm data DATA2 may be input to the cache buffer 160 from an external device such as a test device. In another embodiment, the second algorithm data DATA2 may be input to the cache buffer 160 from a memory controller. In still another embodiment, the second algorithm data DATA2 may be stored in a specific area of the memory cell array 110, read by the read and write circuit 130, and input to the cache buffer 160. The cache buffer 160 may transfer the second algorithm data DATA2 to the microcontroller 141.

Figure 9A:
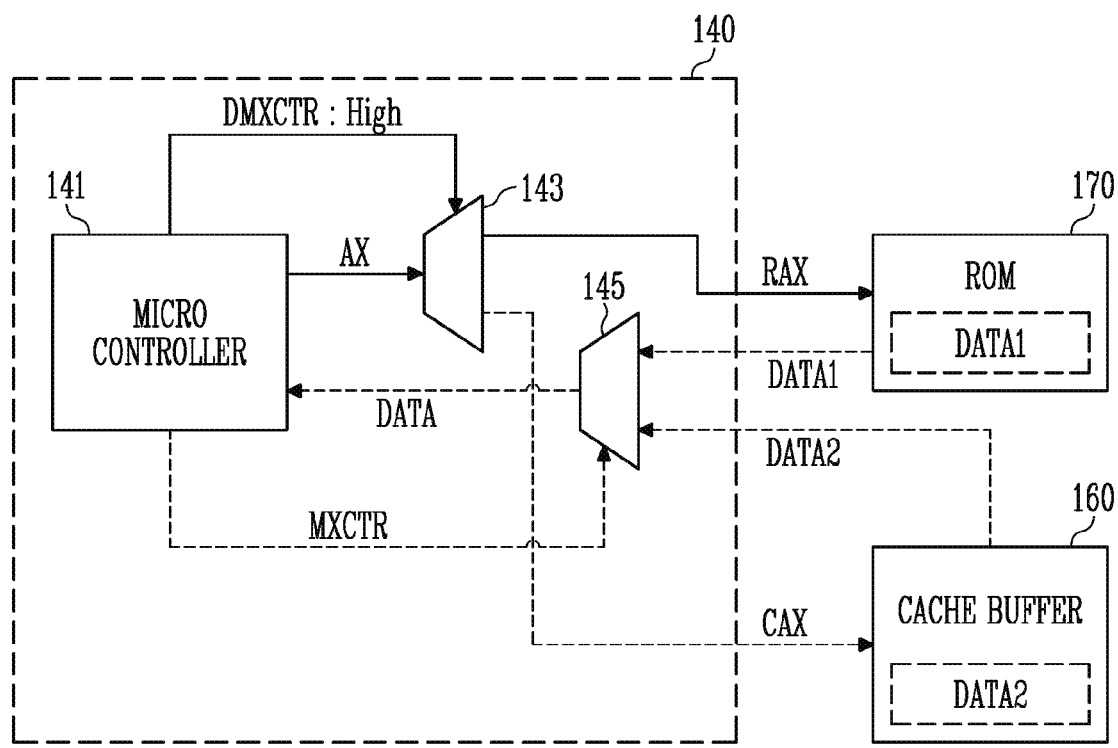
FIGS. 9A and 9B are diagrams, illustrating a first operation of the control logic, shown in FIG. 7.
Figure 9B:
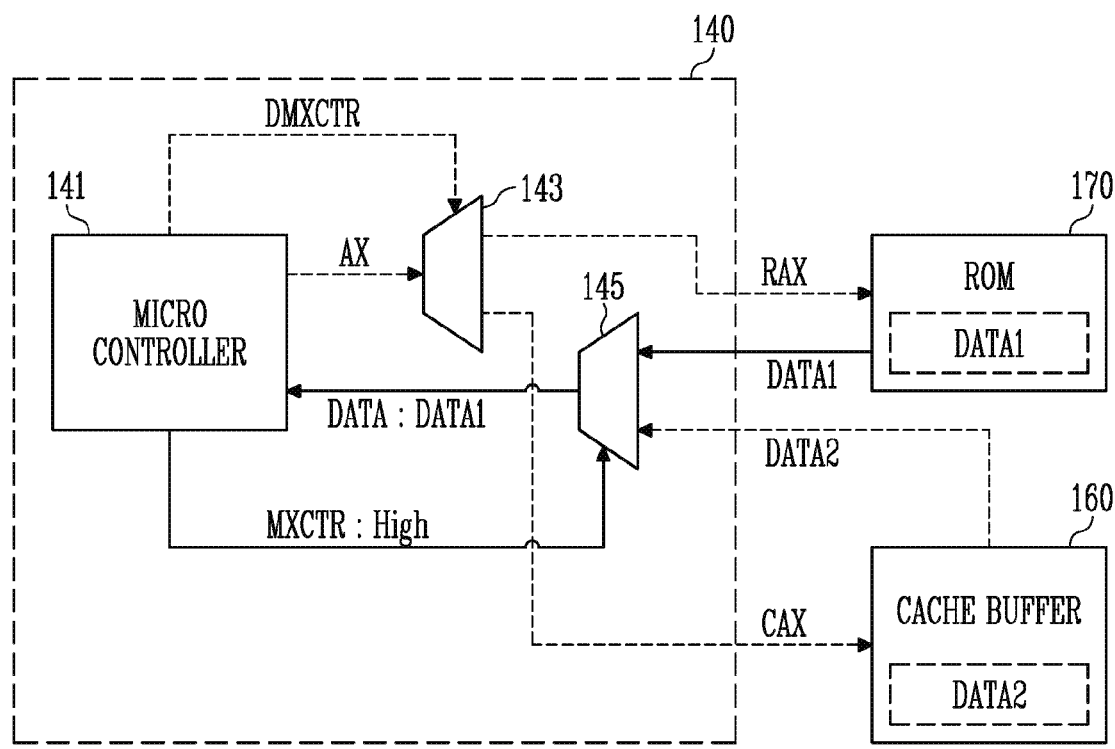

FIGS. 9A and 9B are diagrams that illustrate a first operation of the control logic shown in FIG. 7. More specifically, FIGS. 9A and 9B are diagrams illustrating a process of transferring the first algorithm data DATA1 from the ROM 170 to the microcontroller 141.

First, referring to FIG. 9A, when the microcontroller 141 is required to load the algorithm data during an operation, the microcontroller 141 may determine whether the corresponding algorithm data is stored in the ROM 170 or the cache buffer 160. When the algorithm data is stored in the ROM 170, the microcontroller 141 may output the address data AX that indicates the storage position of the corresponding algorithm data. In addition, the microcontroller 141 may output a DEMUX control signal DMXCTR of a high level. The DEMUX control signal DMXCTR of a high level may be a signal to control the demultiplexer 143 to transfer the input data to the ROM 170. Therefore, based on the DEMUX control signal DMXCTR of a high level, the demultiplexer 143 outputs the address data AX to the ROM 170. In this case, the address data output from the demultiplexer 143 may function as the ROM address data RAX.

Referring to FIG. 9B, the ROM 170 may output the first algorithm data DATA1 in response to the ROM address data RAX. The microcontroller 141 may output the MUX control signal MXCTR of a high level. The MUX control signal MXCTR of a high level may be a signal to control the multiplexer 145 to select the data that is received from the ROM 170 and output the data to the microcontroller 141. Therefore, based on the MUX control signal MXCTR of a high level, the multiplexer 145 selects the first algorithm data DATA1 that is received from the ROM 170 and outputs the first algorithm data DATA1 to the microcontroller 141 as the algorithm data DATA.

Figure 10A:
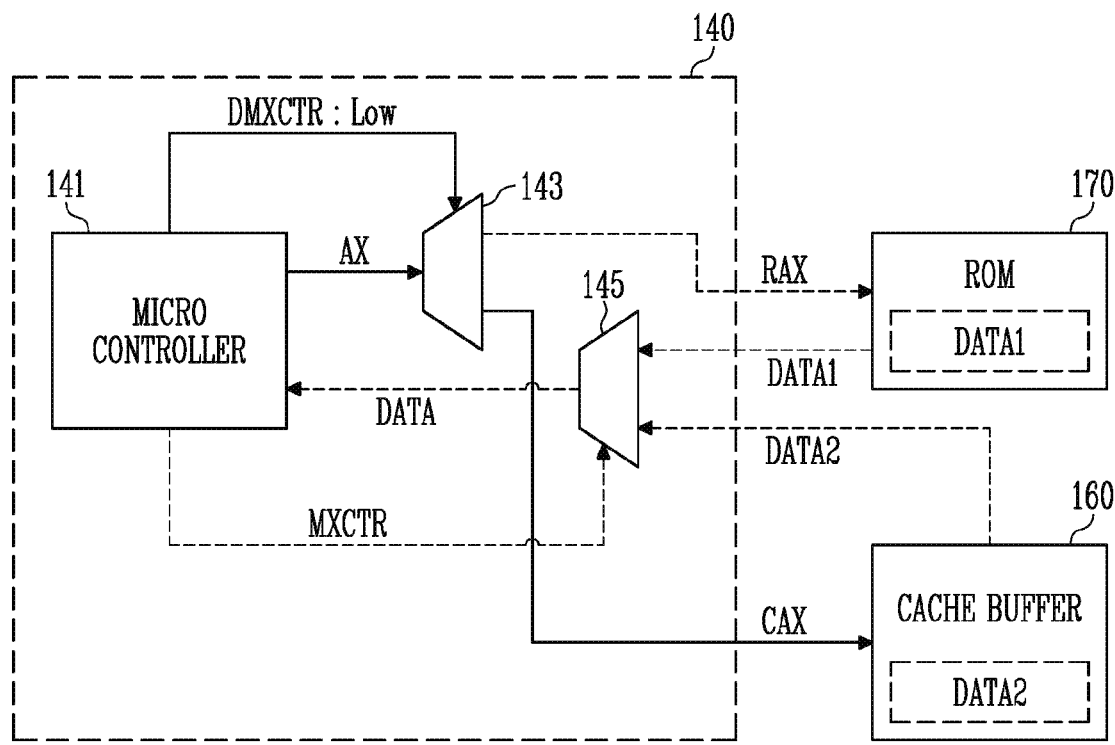
FIGS. 10A and 10B are diagrams, illustrating a second operation of the control logic, shown in FIG. 7.
Figure 10B:
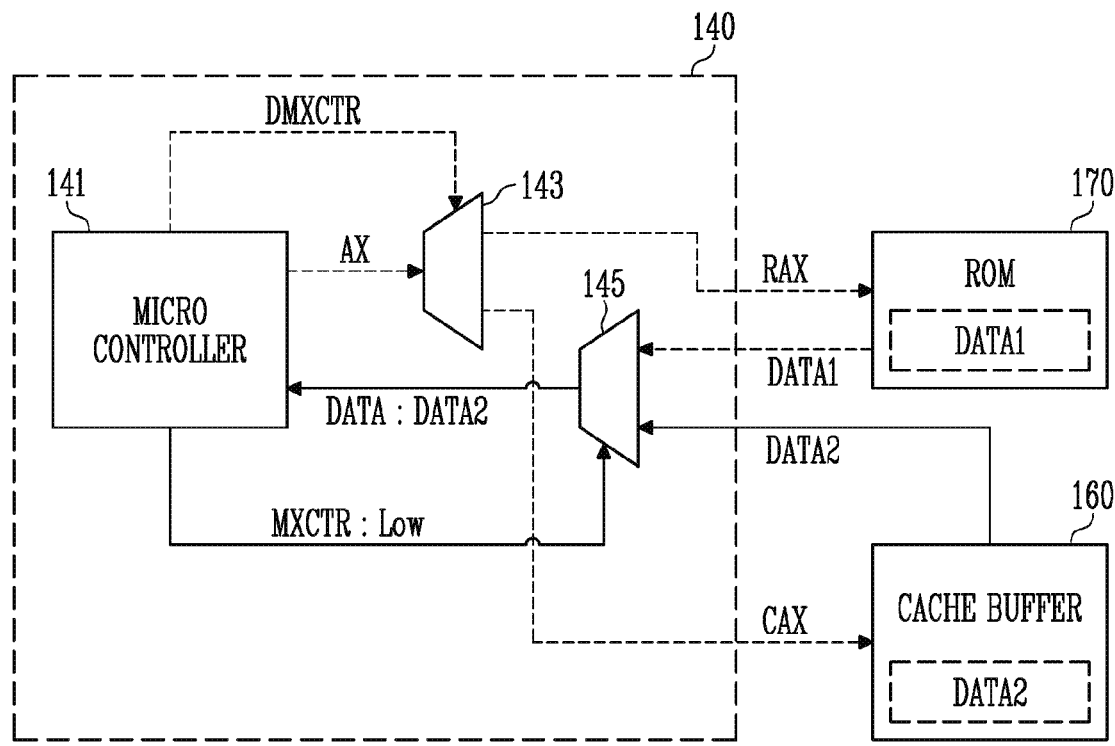

FIGS. 10A and 10B are diagrams that illustrate a second operation of the control logic shown in FIG. 7. More specifically, FIGS. 10A and 10B are diagrams illustrating a process of transferring the second algorithm data DATA2 from the cache buffer 160 to the microcontroller 141.

First, referring to FIG. 10A, when the microcontroller 141 is required to load the algorithm data during an operation, the microcontroller 141 may determine whether the corresponding algorithm data is stored in the ROM 170 or the cache buffer 160. When the algorithm data is stored in the cache buffer 160, the microcontroller 141 may output the address data AX that indicates the storage position of the corresponding algorithm data. In addition, the microcontroller 141 may output a DEMUX control signal DMXCTR of a low level. The DEMUX control signal DMXCTR of a low level may be a signal to control the demultiplexer 143 to transfer the input data to the cache buffer 160. Therefore, based on the DEMUX control signal DMXCTR of a low level, the demultiplexer 143 outputs the address data AX to the cache buffer 160. In this case, the address data output from the demultiplexer 143 may function as the cache address data CAX.

Referring to FIG. 10B, the cache buffer 160 may output the second algorithm data DATA2 in response to the cache address data CAX. The microcontroller 141 may output the MUX control signal MXCTR of the low level. The MUX control signal MXCTR of a low level may be a signal to control the multiplexer 145 to select data that is received from the cache buffer 160 and output the data to the microcontroller 141. Therefore, based on the MUX control signal MXCTR of a low level, the multiplexer 145 selects the second algorithm data DATA2 that is received from the cache buffer 160 and outputs the second algorithm data DATA2 to the microcontroller 141 as the algorithm data DATA.

Figure 11:
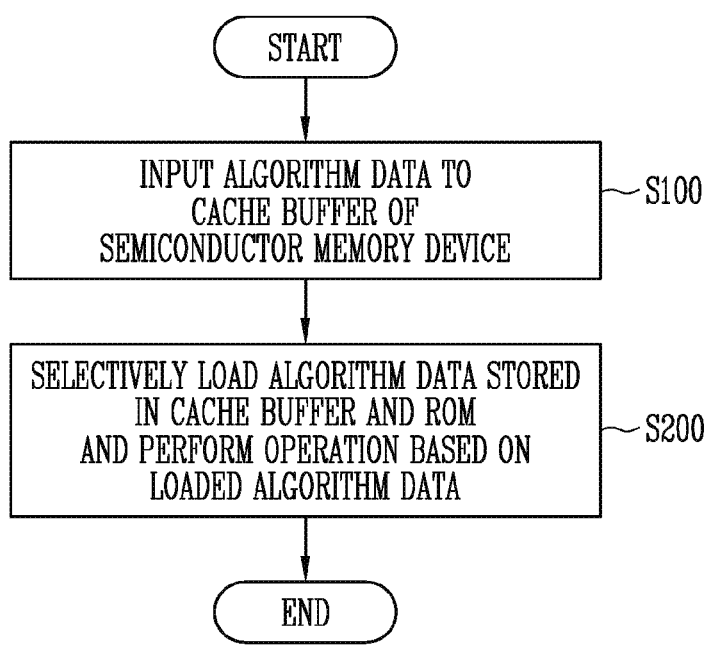
FIG. 11 is a flowchart, illustrating a method of operating the semiconductor memory device, according to an embodiment of the present disclosure.

FIG. 11 is a flowchart, illustrating a method of operating the semiconductor memory device, according to an embodiment of the present disclosure.

Referring to FIG. 11, first, the algorithm data is input to the cache buffer 160 of the semiconductor memory device 100 (S100). As shown in FIG. 8, the algorithm data, input to the cache buffer 160 in step S100, is second algorithm data DATA2, and may be data that is different from the first algorithm data DATA1 that is stored in the ROM 170.

Thereafter, the algorithm data, stored in the cache buffer 160 and the ROM 170, are selectively loaded, and an operation based on the loaded algorithm data is performed (S200). In step S200, the microcontroller 141 may output the address data to the cache buffer 160 or the ROM 170, the address data indicating the position in which the algorithm data to be received is stored. The microcontroller 141 may load the algorithm data, output from one of the cache buffer 160 and the ROM 170, in correspondence therewith. Loading algorithm data may mean storing the algorithm data in an internal memory of the microcontroller 141. The microcontroller 141 may perform an operation corresponding to the algorithm data based on the loaded algorithm data.

A more detailed embodiment of step S200 will be described with reference to FIG. 12.

Figure 12:
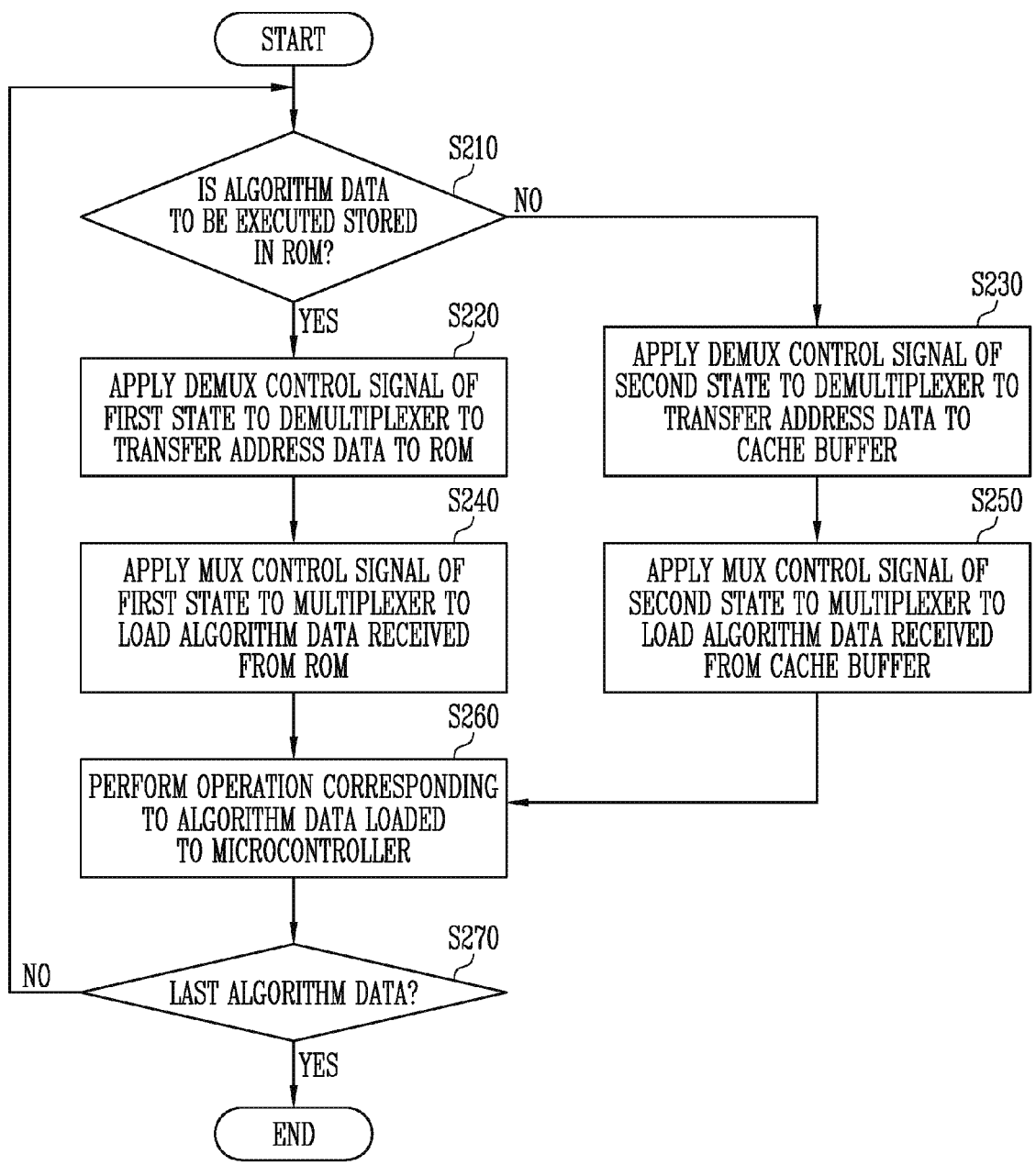
FIG. 12 is a flowchart, illustrating an exemplary embodiment of step S200 of FIG. 11.

FIG. 12 is a flowchart that illustrates an exemplary embodiment of step S200 of FIG. 11.

Referring to FIG. 12, first, it may be determined whether the next algorithm data to be executed by the microcontroller 141 is stored in the ROM (S210). When the algorithm data to be executed is stored in the ROM 170 (S210: Yes), the DEMUX control signal DMXCTR of a first state is applied to the demultiplexer 143 to transfer the address data AX to the ROM 170 (S220). Step S220 may be performed in substantially the same way as described with reference to FIG. 9A. In this case, the DEMUX control signal DMXCTR of the first state may mean the DEMUX control signal DMXCTR of a high level. According to step S220, the address data AX, output from the microcontroller 141, may be transferred to the ROM 170 as the ROM address data RAX.

Thereafter, the MUX control signal MXCTR of the first state is applied to the multiplexer 145 to load the algorithm data, received from the ROM 170, to the microcontroller 141 (S240). Step S240 may be performed in substantially the same way as described with reference to FIG. 9B. In this case, the MUX control signal MXCTR of the first state may mean the MUX control signal MXCTR of a high level. According to step S240, the first algorithm data DATA1, output from the ROM 170, may be transferred to the microcontroller 141 as the algorithm data DATA.

When the algorithm data to be executed is stored in the cache buffer 160 (S210: No), the DEMUX control signal DMXCTR of a second state is applied to the demultiplexer 143 to transfer the address data AX to the cache buffer 160 (S230). Step S230 may be performed in substantially the same way as described with reference to FIG. 10A. In this case, the DEMUX control signal DMXCTR of the second state may mean the DEMUX control signal DMXCTR of a low level. According to step S230, the address data AX, output from the microcontroller 141, may be transferred to the cache buffer 160 as the cache address data CAX.

Thereafter, the MUX control signal MXCTR of the second state is applied to the multiplexer 145 to load the algorithm data received from the cache buffer 160 to the microcontroller 141 (S250). Step S250 may be performed in substantially the same way as described with reference to FIG. 10B. In this case, the MUX control signal MXCTR of the second state may mean the MUX control signal MXCTR of a low level. According to step S250, the second algorithm data DATA2, output from the cache buffer 160, may be transferred to the microcontroller 141 as the algorithm data DATA.

After step S240 or step S250 is performed, the microcontroller 141 performs the operation that corresponds to the algorithm data DATA, which is loaded to the microcontroller 141 (S260). Thereafter, it may be determined whether the performed algorithm data is last algorithm data (S270). When the performed algorithm data is the last algorithm data (S270: Yes), step S200 may end. When the performed algorithm data is not the last algorithm data (S270: No), the process may return to step S210 again to repeatedly perform the above-described operation.

As described above, according to the method of operating the semiconductor memory device 100, according to an embodiment of the present disclosure, the algorithm data, stored in the ROM 170 and the cache buffer 160, may be selectively loaded, and an operation may be performed based on the loaded algorithm data. Therefore, the operation flexibility of the semiconductor memory device 100 may be improved.

In addition, according to the method of operating the semiconductor memory device 100, failure analysis may be more efficiently performed by storing algorithm data in the cache buffer to use the algorithm data for failure analysis after production and before shipment of the semiconductor memory device. In addition, while a user uses the semiconductor memory device after production and sale, a new function of the memory controller may be easily provided in a firmware update form. For example, when a defense code or the like that is newly applied through a firmware update of the memory controller is applied, algorithm data that is used for this may be stored in the cache buffer to be used.

Figure 13:
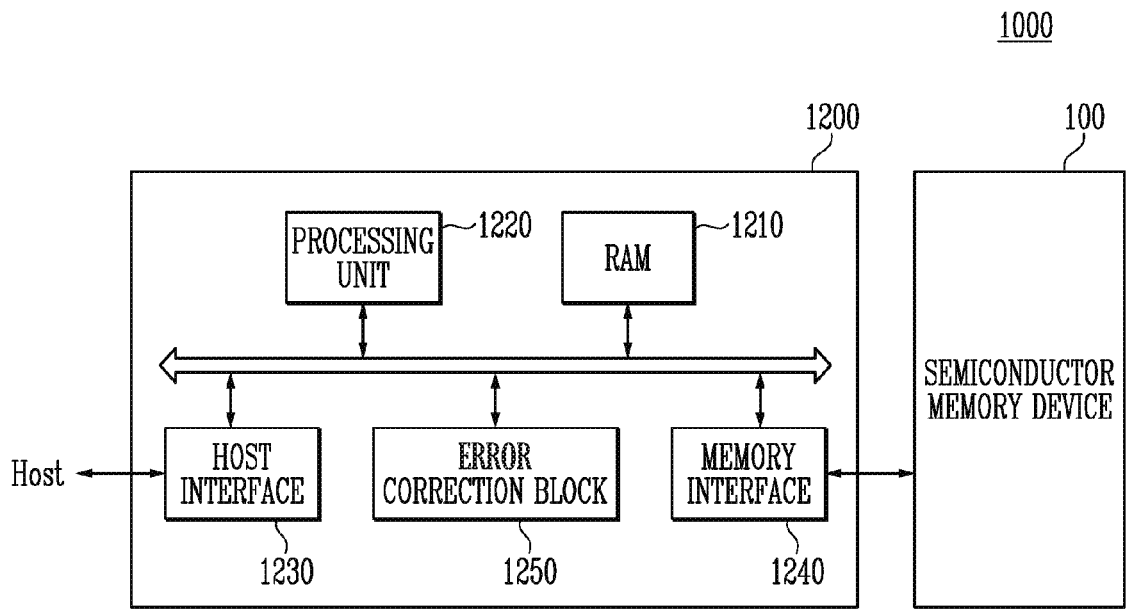
FIG. 13 is a block diagram, illustrating a memory system including the semiconductor memory device of FIG. 1.

FIG. 13 is a block diagram that illustrates a memory system 1000 including the semiconductor memory device 100 of FIG. 1.

Referring to FIG. 13, the memory system 1000 includes the semiconductor memory device 100 and a controller 1200.

The semiconductor memory device 100 may be configured and operate in the same manner as described with reference to FIGS. 1 to 12. Hereinafter, repetitive description is omitted.

The controller 1200 is connected to the host Host and the semiconductor memory device 1300. The controller 1200 may be configured to access the semiconductor memory device 100 in response to the request from the host Host. For example, the controller 1200 may be configured to control read, write, erase, and background operations of the semiconductor memory device 100. The controller 1200 may be configured to provide an interface between the semiconductor memory device 100 and the host Host. The controller 1200 may be configured to drive firmware for controlling the semiconductor memory device 100.

The controller 1200 may include a random access memory (RAM) 1210, a processing unit 1220, a host interface 1230, a memory interface 1240, and an error correction block 1250. The RAM 1210 may be used as at least one of an operation memory of the processing unit 1220, a cache memory between the semiconductor memory device 100 and the host Host, and a buffer memory between the semiconductor memory device 100 and the host Host. The processing unit 1220 may control all operations of the controller 1200.

The host interface 1230 may include a protocol for performing data exchange between the host Host and the controller 1200. As an exemplary embodiment, the controller 1200 may be configured to communicate with the host Host through at least one of various interface protocols such as a universal serial bus (USB) protocol, a multimedia card (MMC) protocol, a peripheral component interconnection (PCI) protocol, a peripheral component interconnect-express (PCI-express) protocol, an advanced technology attachment (ATA) protocol, a serial ATA (SATA) protocol, a parallel ATA (PATA) protocol, a small computer small interface (SCSI) protocol, an enhanced small disk interface (ESDI) protocol, an integrated drive electronics (IDE) protocol, and a private protocol.

The memory interface 1240 may interface with the semiconductor memory device 100. For example, the memory interface may include a NAND interface or a NOR interface.

The error correction block 1250 may be configured to detect and correct an error of data received from the semiconductor memory device 100 using an error correcting code (ECC).

The controller 1200 and the semiconductor memory device 100 may be integrated into one semiconductor device. As an exemplary embodiment, the controller 1200 and the semiconductor memory device 100 may be integrated into one semiconductor device to form a memory card. For example, the controller 1200 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1200 and the semiconductor memory device 100 may be integrated into one semiconductor device to form a semiconductor drive (solid state drive (SSD)). The semiconductor drive (SSD) may include a storage device configured to store data in a semiconductor memory. When the memory system 1000 is used as the semiconductor drive (SSD), an operation speed of the host Host connected to the memory system 1000 may be dramatically improved.

As another example, the memory system 1000 may be provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the semiconductor memory device 100 or memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 14:
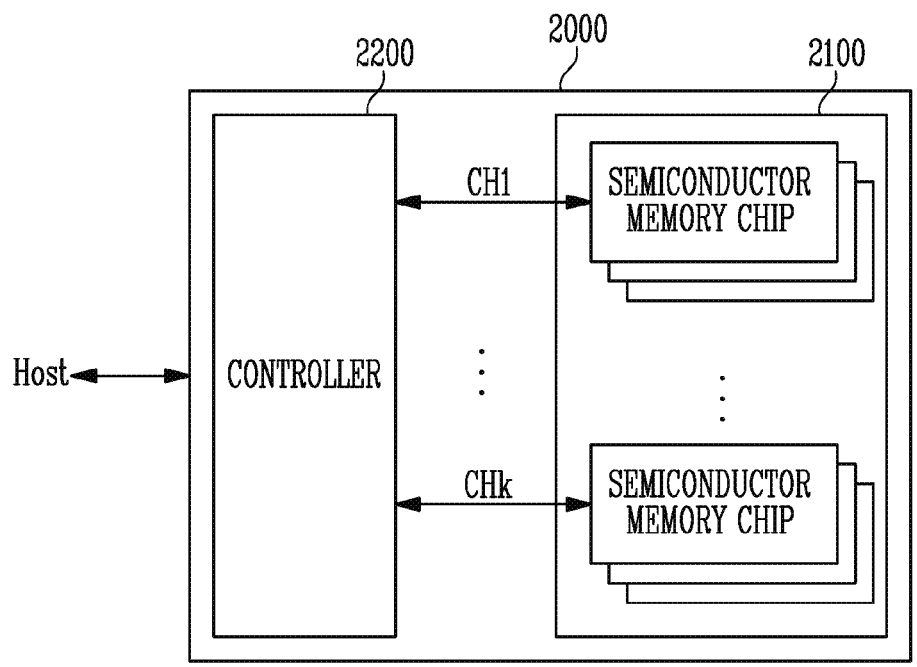
FIG. 14 is a block diagram, illustrating an application example of the memory system of FIG. 13.

FIG. 14 is a block diagram that illustrates an application example 2000 of the memory system 1000 of FIG. 13.

Referring to FIG. 14, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 14, the plurality of groups may communicate with the controller 2200 through first to k-th channels CH1 to CHk, respectively. Each semiconductor memory chip may be configured and operated in a similar manner as the semiconductor memory device 100, described with reference to FIG. 1.

Each group may be configured to communicate with the controller 2200 through one common channel. The controller 2200 may be configured similarly to the controller 1200 described with reference to FIG. 13 and may be configured to control the plurality of memory chips of the semiconductor memory device 2100 through the plurality of channels CH1 to CHk.

In FIG. 14, the plurality of semiconductor memory chips may be connected to one channel. However, it will be understood that the memory system 2000 may be modified so that one semiconductor memory chip is connected to one channel.

Figure 15:
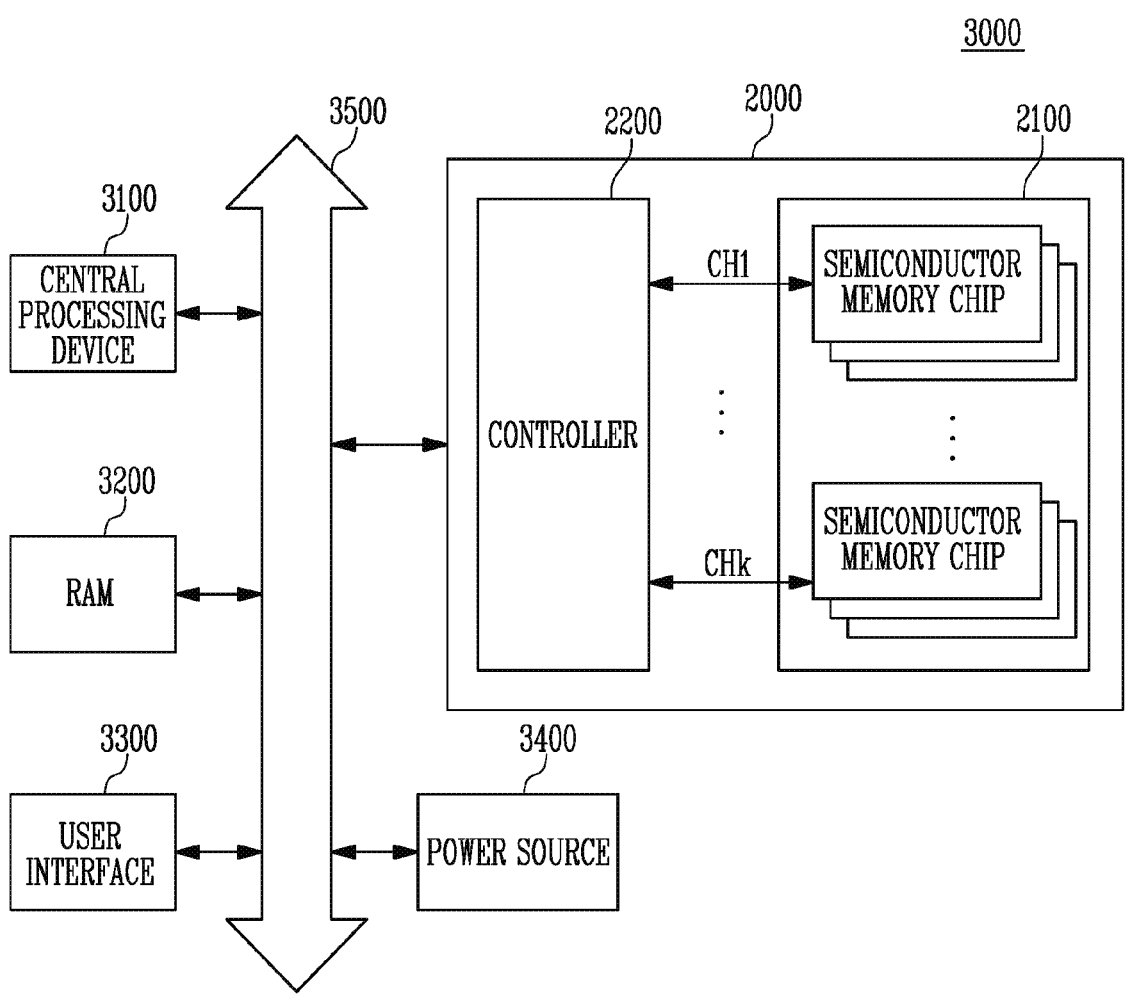
FIG. 15 is a block diagram, illustrating a computing system including the memory system, described with reference to FIG. 14.

FIG. 15 is a block diagram that illustrates a computing system 3000, including the memory system 2000, described with reference to FIG. 14.

Referring to FIG. 15, the computing system 3000 may include a central processing device 3100, a random access memory (RAM) 3200, a user interface 3300, a power source 3400, a system bus 3500, and the memory system 2000.

The memory system 2000 may be electrically connected to the central processing device 3100, the RAM 3200, the user interface 3300, and the power source 3400 through the system bus 3500. Data, provided through the user interface 3300 or processed by the central processing device 3100, is stored in the memory system 2000.

In FIG. 15, the semiconductor memory device 2100 may be connected to the system bus 3500 through the controller 2200. However, the semiconductor memory device 2100 may be configured to be directly connected to the system bus 3500. At this time, a function of the controller 2200 may be performed by the central processing device 3100 and the RAM 3200.

In FIG. 15, the memory system 2000, described with reference to FIG. 14, is provided. However, the memory system 2000 may be replaced with the memory system 1000, described with reference to FIG. 13. As an embodiment, the computing system 3000 may be configured to include both of the memory systems 1000 and 2000, described with reference to FIGS. 13 and 14.

What is claimed is:
1. A semiconductor memory device comprising:
a storage configured to store a first algorithm data;
a buffer configured to store a second algorithm data that is at least partially different from the first algorithm data; and
a control logic configured to selectively receive the first algorithm data and the second algorithm data, the control logic including:
a controller configured to output an address data that indicates a position in which the first or second algorithm data to be executed is stored;
a demultiplexer configured to selectively transfer the address data to one of the storage and the buffer based on the controller; and a multiplexer configured to selectively transfer one of the first algorithm data and the second algorithm data to the controller based on the controller.

2. The semiconductor memory device of claim 1, wherein the controller transfers a DEMUX control signal of a first state to the demultiplexer, and the demultiplexer transfers the address data to the storage based on the DEMUX control signal of the first state.

3. The semiconductor memory device of claim 2, wherein the storage outputs the first algorithm data in response to receiving the address data.

4. The semiconductor memory device of claim 3, wherein the controller transfers a MUX control signal of a first state to the multiplexer, and the multiplexer transfers the first algorithm data to the controller based on the MUX control signal of the first state.

5. The semiconductor memory device of claim 1, wherein the controller transfers a DEMUX control signal of a second state to the demultiplexer, and the demultiplexer transfers the address data to the buffer based on the DEMUX control signal of the second state.

6. The semiconductor memory device of claim 5, wherein the buffer outputs the second algorithm data in response to receiving the address data.

7. The semiconductor memory device of claim 6, wherein the controller transfers a MUX control signal of a second state to the multiplexer, and the multiplexer transfers the second algorithm data to the controller based on the MUX control signal of the second state.

8. The semiconductor memory device of claim 1, wherein the storage is configured of a read-only memory (ROM).

9. The semiconductor memory device of claim 1, wherein the buffer is a cache buffer.

10. A semiconductor memory device comprising:
a storage configured to store a first algorithm data;
a memory cell array including a plurality of memory cells;
a read and write circuit configured to perform any one of a program operation, a read operation, and an erase operation on the memory cell array;
a buffer configured to store at least one of data that is input to the read and write circuit and data that is output from the read and write circuit, the buffer storing a second algorithm data that is at least partially different from the first algorithm data;
and
a control logic configured to control an operation of the read and write circuit and the buffer, the control logic including:
a controller configured to output an address data that indicates a position in which the first or second algorithm data to be executed is stored;
a demultiplexer configured to selectively transfer the address data to one of the storage and the buffer based on the controller; and
a multiplexer configured to selectively transfer one of the first algorithm data and the second algorithm data to the controller based on the controller,
wherein the control logic is configured to selectively receive the first algorithm data and the second algorithm data.

11. The semiconductor memory device of claim 10, wherein the storage is configured of a read-only memory (ROM).

12. The semiconductor memory device of claim 10, wherein the buffer is a cache buffer.

13. A method of operating a semiconductor memory device including a storage storing a first algorithm data, a buffer, and a control logic, the method comprising:
inputting a second algorithm data that is at least partially different from the first algorithm data to the buffer; and
selectively loading one of the first algorithm data and the second algorithm data to the control logic, and performing an operation based on the loaded algorithm data,
wherein selectively loading one of the first algorithm data and the second algorithm data to the control logic, and performing the operation based on the loaded algorithm data comprises:
determining whether an algorithm data to be executed is stored in the storage or in the buffer;
outputting an address data from the control logic based on a result of the determination;
loading the algorithm data to be executed, based on the output address data, to the control logic; and
performing an operation corresponding to the loaded algorithm data.

14. The method of claim 13, wherein when the algorithm data to be executed is stored in the storage, outputting the address data from the control logic based on the determination result comprises demultiplexing the address data and transferring the address data to the storage.

15. The method of claim 14, wherein loading the algorithm data to be executed, based on the output address data, to the control logic comprises multiplexing the first algorithm data and transferring the first algorithm data to the control logic, in response to the address data.

16. The method of claim 13, wherein when the algorithm data to be executed is stored in the buffer, outputting the address data from the control logic based on the determination result comprises demultiplexing the address data and transferring the address data to the buffer.

17. The method of claim 16, wherein loading the algorithm data to be executed, based on the output address data, to the control logic comprises multiplexing the second algorithm data and transferring the second algorithm data to the control logic, in response to the address data.

* * * * *